United States Patent
Chen et al.

(10) Patent No.: US 11,758,692 B2
(45) Date of Patent: Sep. 12, 2023

(54) HEAT DISSIPATION MODULE

(71) Applicant: AURAS TECHNOLOGY CO., LTD., New Taipei (TW)

(72) Inventors: Chien-An Chen, New Taipei (TW); Chien-Yu Chen, New Taipei (TW); Wei-Hao Chen, New Taipei (TW); Bo-Zhang Chen, New Taipei (TW); Chun-Chi Lai, New Taipei (TW); Yun-Kuei Lin, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/195,691

(22) Filed: Mar. 9, 2021

(65) Prior Publication Data

US 2021/0392786 A1    Dec. 16, 2021

Related U.S. Application Data

(60) Provisional application No. 63/038,191, filed on Jun. 12, 2020.

(30) Foreign Application Priority Data

Dec. 8, 2020   (TW) .................................. 109143249

(51) Int. Cl.
*H05K 7/20*   (2006.01)
*F28D 21/00*  (2006.01)
*F28F 3/00*   (2006.01)

(52) U.S. Cl.
CPC .............................. *H05K 7/20509* (2013.01)

(58) Field of Classification Search
CPC ............. H05K 7/2039; H05K 7/20445; H05K 7/20509
USPC .......... 165/80.2, 80.4, 104.33; 361/699, 700, 361/702, 703, 704
See application file for complete search history.

(56) References Cited

U.S. PATENT DOCUMENTS

| | | | | |
|---|---|---|---|---|
| 6,061,235 A | * | 5/2000 | Cromwell | H01L 23/552 361/698 |
| 7,212,407 B2 | * | 5/2007 | Beihoff | H02M 7/003 361/689 |
| 7,616,444 B2 | * | 11/2009 | Munch | F28D 15/0275 165/80.4 |
| 8,369,090 B2 | * | 2/2013 | Chester | F25D 23/12 165/80.4 |
| 8,467,188 B2 | * | 6/2013 | Hsieh | H05K 7/20927 361/698 |
| 8,811,016 B2 | * | 8/2014 | You | H05K 7/20927 361/689 |

(Continued)

FOREIGN PATENT DOCUMENTS

EP    2809138 A2 * 12/2014 ......... H05K 7/20236

*Primary Examiner* — Len Tran
*Assistant Examiner* — Gustavo A Hincapie Serna
(74) *Attorney, Agent, or Firm* — AMIN, TUROCY & WATSON, LLP

(57) ABSTRACT

A heat dissipation module is provided and includes a cold plate having a housing, and a frame body disposed on the housing and having two sidewalls and at least one first rib, where the two sidewalls are positioned at two sides of the housing, respectively, and the first rib is used to provide a deformation resistance so that the heat dissipation module will not be seriously deformed when secured.

15 Claims, 5 Drawing Sheets

(56) References Cited

U.S. PATENT DOCUMENTS

| | | | |
|---|---|---|---|
| 2004/0080912 A1* | 4/2004 | Goth | G06F 1/20 257/E23.098 |
| 2006/0278372 A1* | 12/2006 | Lai | H01L 23/467 165/80.4 |
| 2009/0151908 A1* | 6/2009 | Tu | G06F 1/20 165/185 |
| 2011/0205724 A1* | 8/2011 | Nakajima | B60W 10/08 361/809 |
| 2011/0267776 A1* | 11/2011 | Porreca | H05K 7/1404 361/720 |
| 2014/0009886 A1* | 1/2014 | Moon | H05K 9/002 361/699 |
| 2014/0091453 A1* | 4/2014 | Mori | F28F 3/022 165/104.33 |
| 2015/0173238 A1* | 6/2015 | Nakanishi | H05K 7/14329 29/830 |
| 2015/0296661 A1* | 10/2015 | Mari Curbelo | H01L 23/427 165/104.21 |
| 2015/0306661 A1* | 10/2015 | Yang | B22C 9/108 164/112 |
| 2015/0334874 A1* | 11/2015 | Rai | H01F 27/08 361/699 |
| 2016/0095264 A1* | 3/2016 | Kaneko | H02P 29/60 361/699 |
| 2016/0363967 A1* | 12/2016 | Tsai | H05K 7/20272 |
| 2017/0235350 A1* | 8/2017 | Tsai | G06F 1/20 165/80.4 |
| 2020/0039324 A1* | 2/2020 | Adachi | F24H 1/10 |
| 2020/0053866 A1* | 2/2020 | Lim | B60H 1/2221 |
| 2020/0173728 A1* | 6/2020 | Pan | G06F 1/20 |
| 2020/0227341 A1* | 7/2020 | Neal | H01L 23/367 |
| 2021/0222608 A1* | 7/2021 | Tu | F28F 3/12 |
| 2021/0392779 A1* | 12/2021 | Chen | H05K 7/20254 |
| 2022/0142013 A1* | 5/2022 | Zhou | H05K 7/20927 361/702 |

* cited by examiner

HEAT DISSIPATION MODULE

BACKGROUND

1. Technical Field

The present disclosure relates to the field of heat dissipation. More specifically, the present disclosure relates to a heat dissipation module.

2. Description of Related Art

In the face of modernization, computers and various electronic devices have seen rapid developments with continuously improved performance. However, along with these improvements, heat dissipation has become one of the major issues faced by high performance hardware. Typically, computers and electronic devices employ heat dissipation components to dissipate heat away. For example, a thermal paste or cooling fins can be attached onto an electronic component that is subjected to heat dissipation in order to absorb and disperse heat. However, this type of heat dissipation method has a limited heat dissipation effect, and thus modules that dissipate heat through liquid cooling have been developed.

Existing heat dissipation modules using liquid cooling method typically use cooling liquids to absorb heat energy. For example, after allowing a cooling liquid to flow through an electronic component subject to heat dissipation, the heated cooling liquid can then flow to a place with a lower temperature in order for heat exchange to take place. After heat is exchanged, the cooling liquid can return to the electronic component subject to heat dissipation to absorb more heat energy, thereby creating a circulation of heat dissipation.

However, when the conventional heat dissipation module is applied to a heat source, it will generally need to be securely mounted via securing members. When each securing member secures each corner end of the heat dissipation module, the overall heat dissipation module is often severely deformed, which not only prevents the precise assembly of each component of the heat dissipation module (e.g., the heat dissipation module cannot be easily contacted with a heat source, and heat dissipation fins are easily peeled or fall off, etc.), but also affects the original heat dissipation performance of the heat dissipation module.

Therefore, there is a need to provide a heat dissipation module that effectively addresses the aforementioned shortcomings of the prior art.

SUMMARY

The present disclosure provides a heat dissipation module, which comprises: a cold plate having a housing; and a frame body disposed on the housing and having two sidewalls and at least one first rib, wherein after the frame body is disposed on the housing, the two sidewalls are positioned at two sides of the housing, respectively, such that the frame body covers the housing, and the first rib is used to provide a deformation resistance after the frame body is coupled with the housing.

In the above-described heat dissipation module, a first recess and a plurality of first protrusions positioned at two ends of the first recess are formed on a surface of the housing in contact with the frame body.

In the above-described heat dissipation module, a second protrusion and a plurality of second recesses positioned at two ends of the second protrusion are formed on a surface of the frame body in contact with the housing, wherein a shape of the second protrusion corresponds to the first recess, and a shape of the plurality of second recesses corresponds to the plurality of first protrusions.

In the above-described heat dissipation module, the frame body has a plurality of the first ribs.

In the above-described heat dissipation module, the plurality of first ribs are parallel to the two sidewalls and disposed between the two sidewalls, and the plurality of first ribs cross the first recess and the plurality of first protrusions concurrently.

In the above-described heat dissipation module, a position of one of the plurality of first ribs corresponds to the first recess of the housing, and positions of the others of the plurality of first ribs correspond to the plurality of first protrusions of the housing.

In the above-described heat dissipation module, the two sidewalls extend along a first direction, and the first rib extends along a second direction and connects with the two sidewalls.

In the above-described heat dissipation module, the first direction is perpendicular to the second direction.

In the above-described heat dissipation module, the frame body further comprises at least one second rib, and the second rib positioned between the two sidewalls extends along the first direction and crosses the first rib to provide the deformation resistance after the frame body is coupled with the housing.

In the above-described heat dissipation module, an inside of the housing is provided with at least one cooling channel passing through the housing along the first direction, and the cooling channel is filled with a working medium for absorbing heat energy.

In the present disclosure, the above-described heat dissipation module further comprises a frame disposed on a circuit board and surrounding a heat source of the circuit board, where the frame body is further disposed on the frame to secure the cold plate on the heat source.

In the present disclosure, the above-described heat dissipation module further comprises a plurality of securing columns provided on corners of the frame, where corners of the frame body are provided with a plurality of securing holes for the plurality of securing columns to pass through.

In the present disclosure, the above-described heat dissipation module further comprises a plurality of securing members coupled onto the plurality of securing columns, respectively, to secure the frame body on the frame.

In the above-described heat dissipation module, the frame body further comprises at least one third rib disposed between the first rib and a plane where the plurality of securing holes are located, wherein the third rib couples the plane and the first rib.

In the above-described heat dissipation module, the third rib is located on a line between the plurality of securing holes adjacent to the same sidewall.

In the above-described heat dissipation module, the frame body is a die-cast member made of metal material.

In the above-described heat dissipation module, the metal is aluminum, steel, or stainless steel.

DETAILED DESCRIPTION

Embodiments of the present disclosure are illustrated with specific implementations. Other advantages and technical effects of the present disclosure can be readily understood by one of ordinary skill in the art upon reading the disclosure provided herein, and can be used or applied in other different implementations.

The heat dissipation module provided by the present disclosure can be installed in electronic devices such as computer hosts or servers. The heat dissipation module can be filled with working medium (e.g., cooling liquid or coolant) inside, and the working medium can absorb the heat energy generated from heat source (e.g., electronic components such as chips or memories). The heated working medium can be transferred to a condensing device for cooling, and the cooled working medium can be transferred back to the heat dissipation module so as to perform the next heat absorption and circulation flow.

Figure 1:
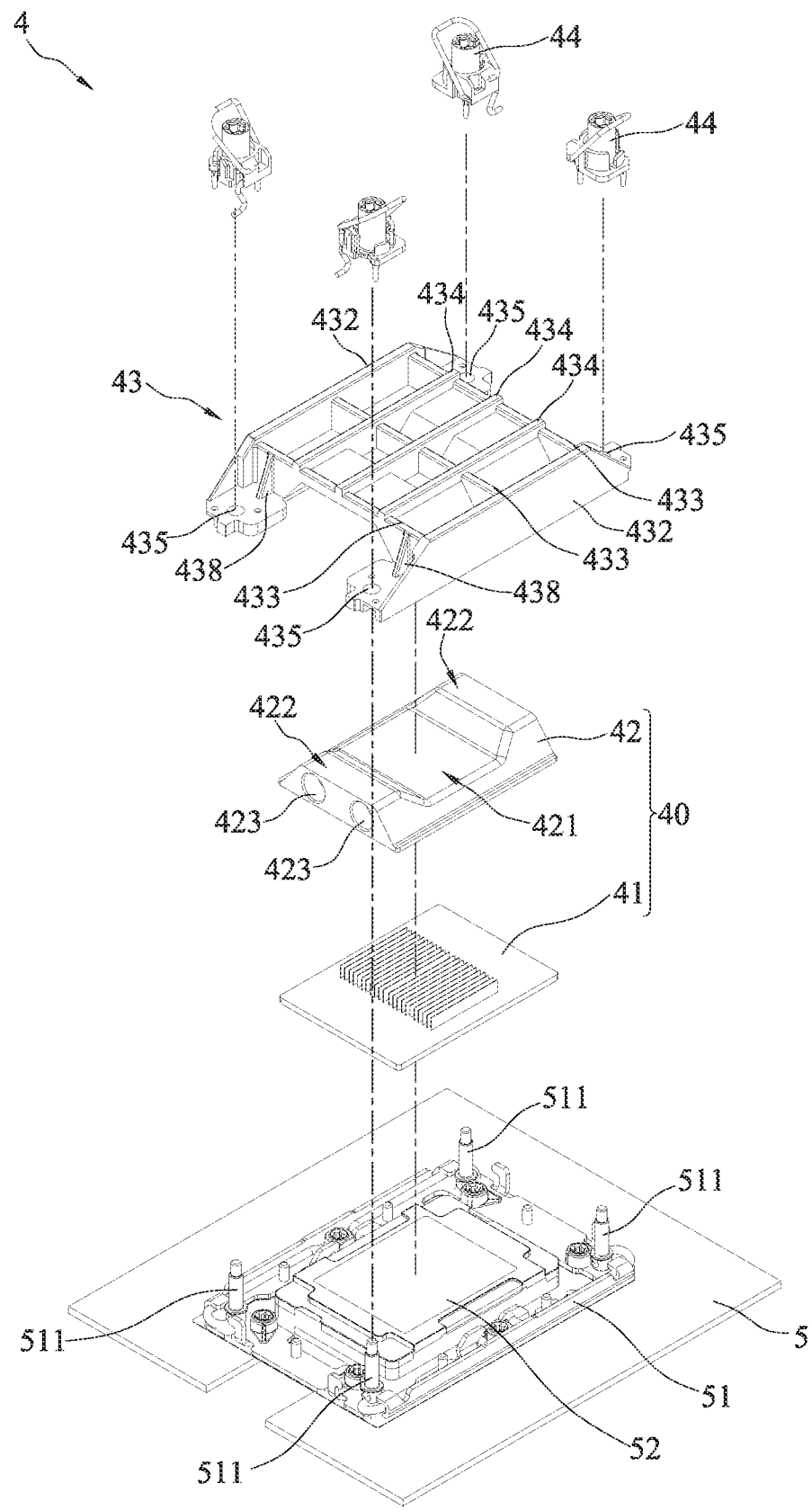
FIG. 1 is an exploded isometric view of a heat dissipation module in accordance with the present disclosure.

Referring to FIG. 1, a heat dissipation module 4 according to the present disclosure comprises a cold plate 40 and a frame body 43. The cold plate 40 comprises a heat conducting structure 41 and a housing 42. The housing 42 is disposed on the heat conducting structure 41, and the frame body 43 is disposed on the housing 42. In an embodiment, the frame body 43 comprises two sidewalls 432 and at least one first rib 433, wherein after the frame body 43 is coupled (e.g., coupled by pressing) with the housing 42, the two sidewalls 432 can extend along a first direction and position at two sides of the housing 42, respectively, so that the frame body 43 can cover the housing 42 as well as the heat conducting structure 41. The first rib 433 is used to provide a deformation resistance after the frame body 43 is coupled with the housing 42.

In an embodiment, the heat conducting structure 41 can be a metal plate, or fins provided on a metal plate, wherein the material of the heat conducting structure 41 can be copper or aluminum, but the present disclosure is not limited to as such.

Figure 2:
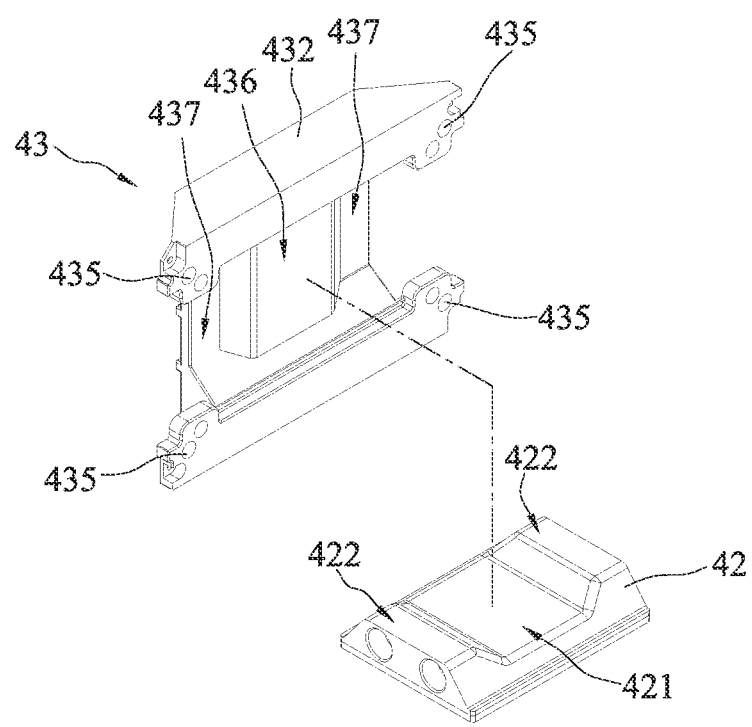
FIG. 2 is a schematic diagram illustrating an assembly of a frame and a housing of a heat dissipation module in accordance with the present disclosure.

In an embodiment, referring to FIG. 2, a first recess 421 and a plurality of first protrusions 422 are formed on a surface of the housing 42 in contact with the frame body 43, wherein the plurality of first protrusions 422 are positioned at two ends of the first recess 421. A second protrusion 436 and a plurality of second recesses 437 are formed on a surface of the frame body 43 in contact with the housing 42, wherein the plurality of second recesses 437 are positioned at two ends of the second protrusion 436, the shape of the second protrusion 436 is corresponding to the first recess 421, and the shape of the plurality of second recesses 437 are corresponding to the plurality of first protrusions 422. As such, when the frame body 43 is coupled with the housing 42, the frame body 43 and the housing 42 can be coupled tightly, and the relative position between the frame body 43 and the housing 42 can be secured through the shape matching between the first recess 421, the first protrusions 422, the second protrusion 436 and the second recesses 437.

In an embodiment, the number of the first rib 433 can be one or more, and the present disclosure is not limited to as such. For example, when there is one first rib 433, the first rib 433 can extend along a second direction, and two ends of the first rib 433 are connected with the two sidewalls 432, respectively. At this time, the first direction is perpendicular to the second direction, so that the first rib 433 is perpendicular to the two sidewalls 432 in practice, and the position of the first rib 433 can further correspond to the first recess 421 of the housing 42.

In another embodiment, when there are a plurality of first ribs 433, the plurality of first ribs 433 can also extend along the second direction, and the two ends of the plurality of first ribs 433 are connected with the two sidewalls 432, respectively; that is, the plurality of first ribs 433 are all perpendicular to the two sidewalls 432. At this time, the position of one of the plurality of first ribs 433 can be corresponding to the first recess 421 of the housing 42, and the positions of the other of the plurality of first ribs 433 can be corresponding to the first protrusions 422 of the housing 42. For example, when the number of the first ribs 433 is three, one first rib 433 can be corresponding to the first recess 421, while the other two first ribs 433 can be corresponding to the two first protrusions 422, respectively, but the present disclosure is not limited to as such.

In an embodiment, the frame body 43 of the heat dissipation module 4 according to the present disclosure further comprises at least one second rib 434. The second rib 434 extends along the first direction and is positioned between the two sidewalls 432; that is, the second rib 434 can be parallel to the two sidewalls 432. In addition, the second rib 434 can cross the first rib 433. For example, the second rib 434 can cross the first rib 433 corresponding to the first recess 421, and two ends of the second rib 434 can be respectively disposed on the first rib 433 corresponding to the first protrusions 422. Therefore, the second rib 434 can provide the deformation resistance after the frame body 43 is coupled with the housing 42.

In an embodiment, the frame body 43 can be provided with only the first rib 433, or provided with the first rib 433 and the second rib 434 concurrently, and the number of the first rib 433 and the second rib 434 can be provided according to the needs. In another embodiment, the frame body 43 can also be provided with only the second rib 434 instead of the first rib 433, and the position of the second rib 434 can simultaneously cross the first recess 421 and the plurality of first protrusions 422 of the housing 42, but the present disclosure is not limited to as such.

Figure 3:
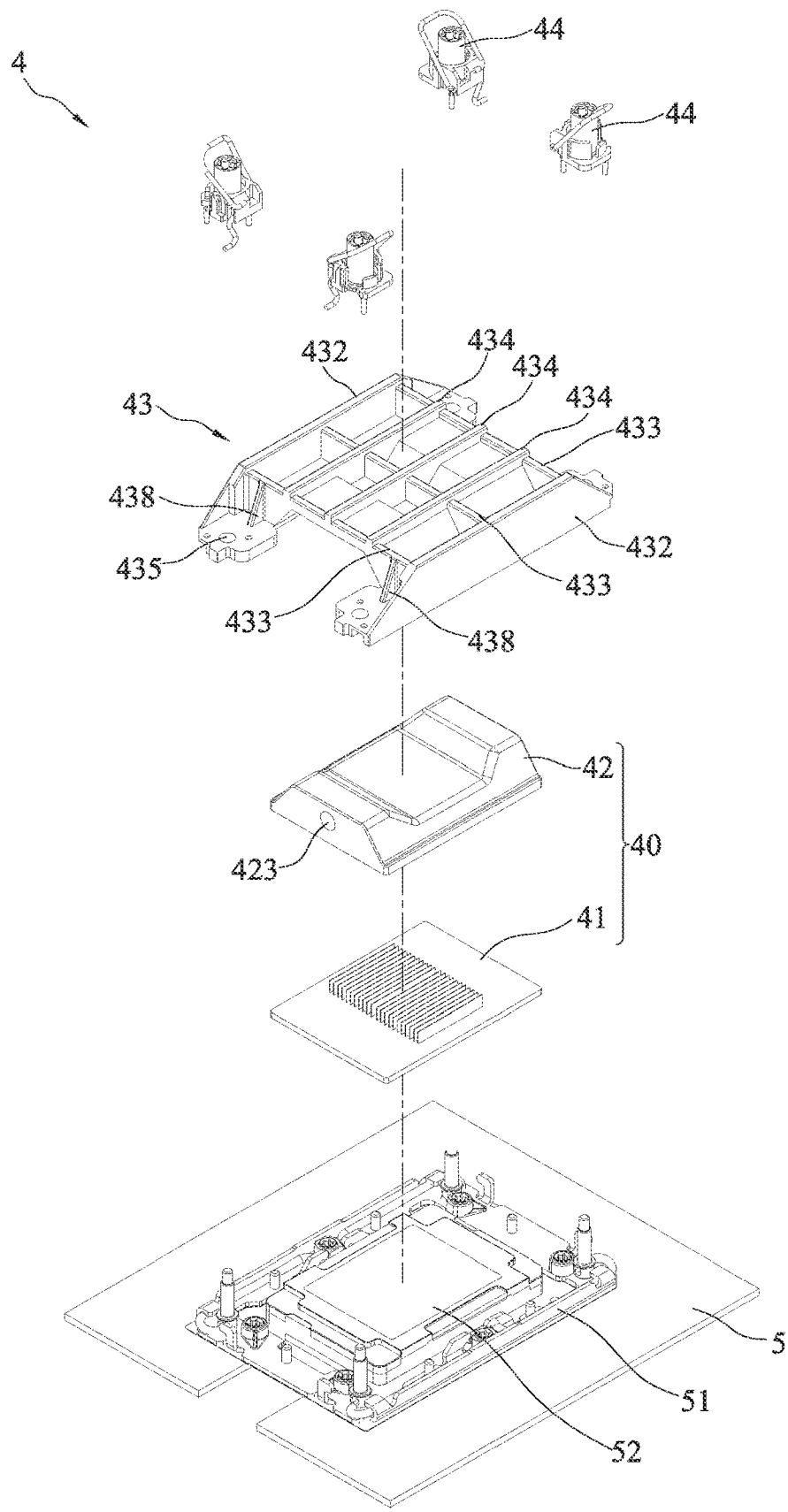
FIG. 3 is an exploded isometric view of another embodiment of a heat dissipation module in accordance with the present disclosure.

In an embodiment, the inside of the housing 42 is provided with at least one cooling channel 423 passing through the housing 42 along the first direction. The cooling channel 423 is filled with the working medium, and the working medium is used for absorbing the heat energy of a heat source 52 contacted by the heat conducting structure 41. Two ends of the cooling channel 423 can be connected via a pipe to formed a circulation, in which a water cooling exhaust (such as a fan) for cooling the working medium can be connected. In an embodiment, there can be two cooling channels 423. In another embodiment, as shown in FIG. 3, there can be one cooling channel 423. However, the present disclosure does not limit the number of the cooling channel 423.

In an embodiment, the heat dissipation module 4 according to the present disclosure further comprises a frame 51. The frame 51 is disposed on a circuit board 5 and surrounds the heat source 52 of the circuit board 5, and a plurality of securing columns 511 are provided on the corners of the frame 51. The frame body 43 is disposed on the frame 51 to secure the cold plate 40 on the heat source 52. In addition, a plurality of securing holes 435 are arranged at the corners of the frame body 43, respectively. When the frame body 43 is disposed on the housing 42, the securing columns 511 of the frame 51 can be inserted through the securing holes 435 of the frame body 43, and a plurality of securing members 44 are coupled onto the plurality of securing columns 511, respectively, to secure the housing 42 on the frame 51. In an embodiment, the coupling between the securing members 44 and the securing columns 511 can be using screw threads, but can also be using a snap structure, and the present disclosure is not limited to as such.

Figure 5A:
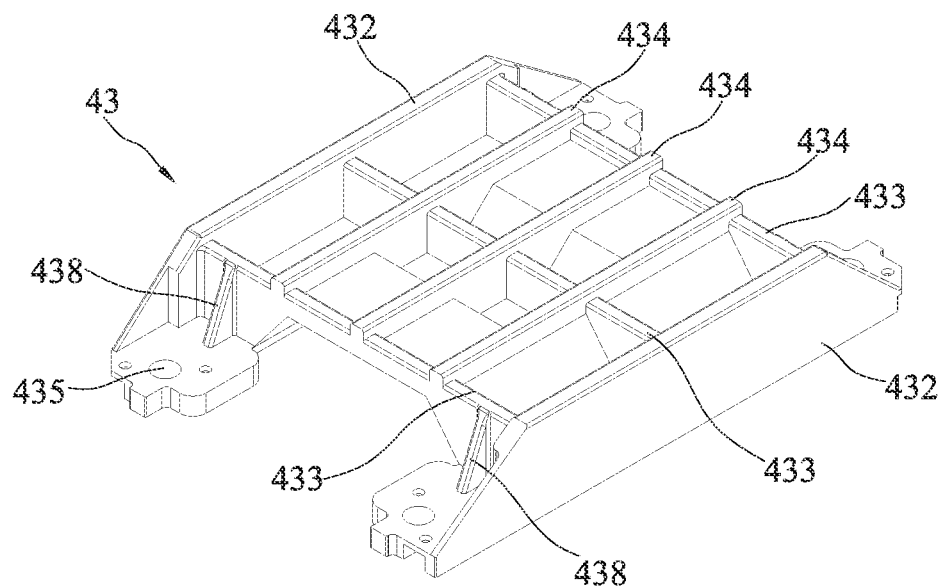
FIG. 5A is a schematic isometric view of the frame body of FIG. 1.
Figure 5B:
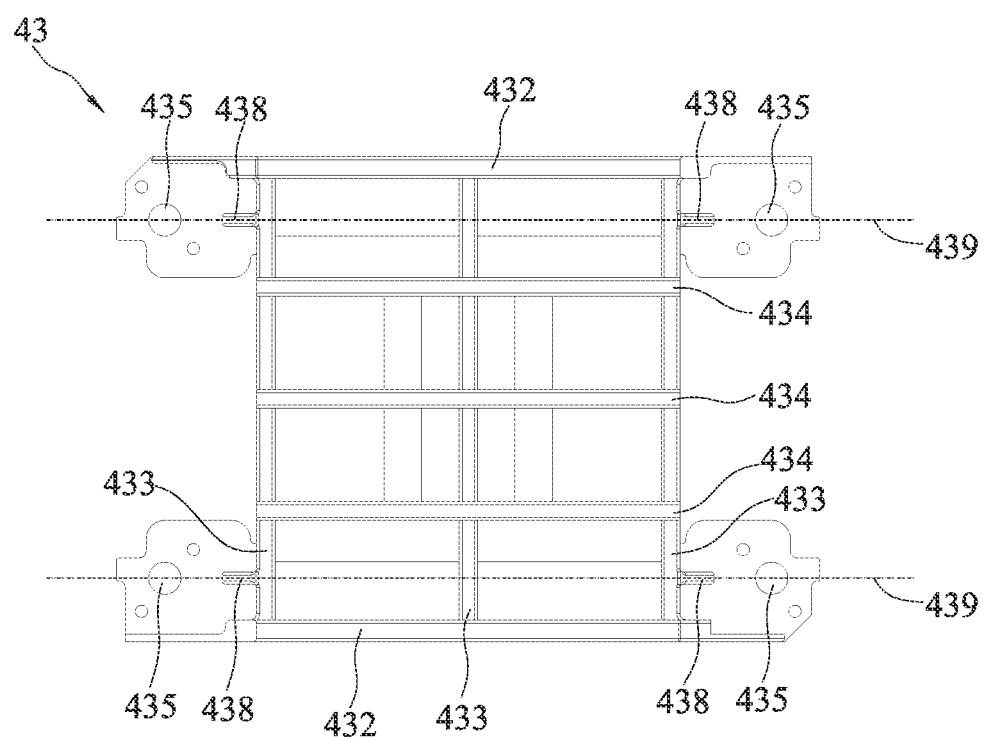
FIG. 5B is a schematic top view of the frame body of FIG. 5A.

In an embodiment, referring to FIG. 1 and FIG. 5A, depending on the needs, the frame body 43 can further comprise at least one third rib 438. The third rib 438 is disposed between the first rib 433 and the plane where the securing hole 435 is located. Specifically, the first rib 433 can be vertical to the plane where the securing hole 435 is located, and the third rib 438 can also extend vertically outward from the plane where the securing hole 435 is located and couple with the first rib 433 and the plane where the securing hole 435 is located. In addition, the third ribs 438 can further be located on the line between the plurality of securing holes 435 adjacent to the same sidewall 432. For example, the securing holes 435 and the third ribs 438 on the upper left and the upper right of FIG. 5B are located on the line 439, and the securing holes 435 and the third ribs 438 on the lower left and the lower right of FIG. 5B are located on the line 439. As such, with the arrangement of the third ribs 438, when the frame body 43 is secured on the frame 51 of the circuit board 5, the third ribs 438 can enhance the deformation resistance of the plane where the securing holes 435 are located.

In an embodiment, the frame body 43 can be a die-cast member and made of, for example, metal material (aluminum, steel, or stainless steel), but the present disclosure is not limited to as such.

Figure 4:
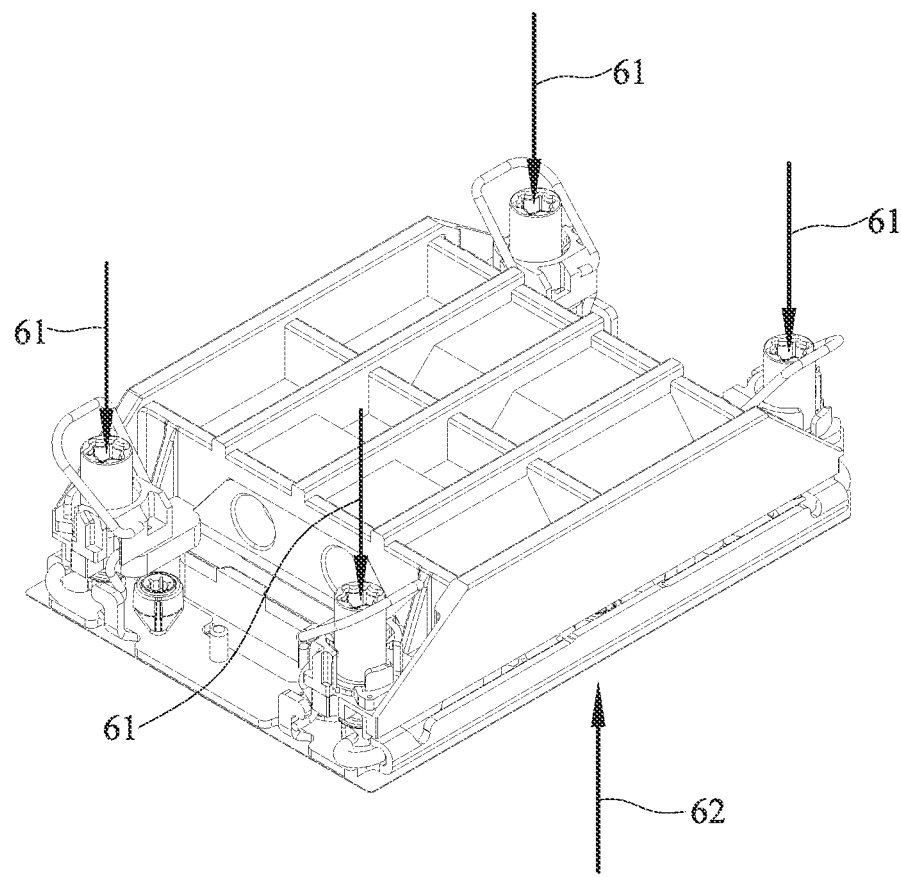
FIG. 4 is a schematic diagram illustrating an application of a heat dissipation module in accordance with the present disclosure.

Referring to FIG. 4, with the design of the sidewalls 432, the first ribs 433 and/or the second ribs 434 on the frame body 43 of the heat dissipation module 4, when the frame body 43 is secured on the frame 51 of the circuit board 5, the reaction force 62 caused by the downward stress 61 of the securing member 44 will be offset by the deformation resistance provided by the sidewalls 432, the first ribs 433 and/or the second ribs 434 (and the third ribs 438, for example, when requiring to further strengthen the deformation resistance, the third ribs 438 can be added to FIG. 1, FIG. 5A and FIG. 5B as needed). Therefore, the entire heat dissipation module 4 will not be severely deformed, and the heat conducting structure 41, the housing 42 and the frame body 43 can still be coupled tightly, such that the original heat dissipation performance of the heat dissipation module 4 will not be affected.

The above embodiments are merely provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A heat dissipation module, comprising:
a cold plate having a housing; and
a frame body disposed on the housing and having two sidewalls and at least one first rib, wherein after the frame body is disposed on the housing, the two sidewalls are positioned at two sides of the housing, respectively, such that the frame body covers the housing, and the first rib crosses the housing overall and is used to provide a deformation resistance after the frame body is coupled with the housing,
wherein a surface of the housing in contact with the frame body has a first recess and a plurality of first protrusions positioned at two ends of the first recess,
wherein a surface of the frame body in contact with the housing has a second protrusion and a plurality of second recesses positioned at two ends of the second protrusion, and wherein a shape of the second protrusion corresponds to the first recess, and a shape of the plurality of second recesses corresponds to the plurality of first protrusions.

2. The heat dissipation module of claim 1, wherein the frame body has a plurality of the first ribs.

3. The heat dissipation module of claim 2, wherein the plurality of first ribs are perpendicular to the two sidewalls and disposed between the two sidewalls.

4. The heat dissipation module of claim 2, wherein a position of one of the plurality of first ribs corresponds to the first recess of the housing, and a position of at least one of the others of the plurality of first ribs correspond to at least one of the plurality of first protrusions of the housing.

5. The heat dissipation module of claim 1, wherein the two sidewalls extend along a first direction, and the first rib extends along a second direction and connects with the two sidewalls.

6. The heat dissipation module of claim 5, wherein the first direction is perpendicular to the second direction.

7. The heat dissipation module of claim 6, wherein the frame body further comprises at least one second rib, and wherein the second rib positioned between the two sidewalls extends along the first direction and crosses the first rib, the first recess and the plurality of first protrusions concurrently to provide the deformation resistance after the frame body is coupled with the housing.

8. The heat dissipation module of claim 5, wherein an inside of the housing is provided with at least one cooling channel passing through the housing along the first direction, and the cooling channel is filled with a working medium for absorbing heat energy.

9. The heat dissipation module of claim 1, further comprising a frame disposed on a circuit board and surrounding a heat source of the circuit board, wherein the frame body is further disposed on the frame to secure the cold plate on the heat source.

10. The heat dissipation module of claim 9, further comprising a plurality of securing columns provided on corners of the frame, wherein corners of the frame body are provided with a plurality of securing holes for the plurality of securing columns to pass through.

11. The heat dissipation module of claim 10, further comprising a plurality of securing members coupled onto the plurality of securing columns, respectively, to secure the frame body on the frame.

12. The heat dissipation module of claim 10, wherein the frame body further comprises at least one third rib disposed between the first rib and a plane where the plurality of securing holes are located, and wherein the third rib couples the plane and the first rib.

13. The heat dissipation module of claim 12, wherein the third rib is located on a line between the plurality of securing holes adjacent to the same sidewall.

14. The heat dissipation module of the claim 1, wherein the frame body is a die-cast member made of metal material.

15. The heat dissipation module of the claim 14, wherein the metal is aluminum, steel, or stainless steel.

\* \* \* \* \*